(12) United States Patent
Jin et al.

(10) Patent No.: US 11,169,402 B2
(45) Date of Patent: Nov. 9, 2021

(54) SUPERLATTICE MATERIAL, AND PREPARATION METHOD AND APPLICATION THEREOF

(71) Applicant: University of Electronic Science and Technology of China, Chengdu (CN)

(72) Inventors: Lichuan Jin, Chengdu (CN); Kancheng Jia, Chengdu (CN); Dainan Zhang, Chengdu (CN); Huaiwu Zhang, Chengdu (CN); Zhiyong Zhong, Chengdu (CN); Qinghui Yang, Chengdu (CN); Xiaoli Tang, Chengdu (CN); Feiming Bai, Chengdu (CN)

(73) Assignee: University of Electronic Science and Technology of China

( * ) Notice: Subject to any disclaimer, the term of this patent is extended or adjusted under 35 U.S.C. 154(b) by 77 days.

(21) Appl. No.: 16/502,514

(22) Filed: Jul. 3, 2019

(65) Prior Publication Data
US 2020/0341301 A1    Oct. 29, 2020

(30) Foreign Application Priority Data
Apr. 29, 2019 (CN) .......................... 201910354441.4

(51) Int. Cl.
*G11B 11/105* (2006.01)
*H01F 10/32* (2006.01)
(Continued)

(52) U.S. Cl.
CPC ............ *G02F 1/091* (2013.01); *C23C 14/083* (2013.01); *C23C 14/085* (2013.01); *C23C 14/28* (2013.01);
(Continued)

(58) Field of Classification Search
None
See application file for complete search history.

(56) References Cited

U.S. PATENT DOCUMENTS 4,624,901 A * 11/1986 Glass ............... B82Y 25/00
428/469
5,501,913 A * 3/1996 Shimokawa ....... B82Y 25/00
428/822.2
(Continued)

FOREIGN PATENT DOCUMENTS

CN     107190321 A   *   9/2017

OTHER PUBLICATIONS

Derwent Abstract Translation of CN 107190321 A (Year: 2017).*
(Continued)

*Primary Examiner* — Kevin M Bernatz
(74) *Attorney, Agent, or Firm* — IP Attorneys Group

(57) ABSTRACT

The present invention relates to the technical field of superlattice magneto-optical material technologies, and in particular, to a superlattice material, and a preparation method and application thereof. According to description of embodiments, the superlattice material provided in the present invention has both a relatively good magnetic property of a ferrous garnet material and a good photoelectric absorption characteristic of a two-dimensional semiconductor material such as graphene. Magneto-optical Kerr effect data obtained through testing shows that: A saturated magneto-optical Kerr angle of the superlattice material in the present invention is 13 mdeg in a magnetic field of 2500 Oe, and a magneto-optical Kerr angle of the superlattice material is increased by 2.5 times compared with a nonsuperlattice ferrimagnetic thin film material into which no two-dimensional material is inserted, thereby achieving magneto-optical effect enhancement.

10 Claims, 4 Drawing Sheets

(51) Int. Cl.
  *H01F 41/32* (2006.01)
  *H01F 10/30* (2006.01)
  *H01F 10/28* (2006.01)
  *G02F 1/09* (2006.01)
  *C23C 14/08* (2006.01)
  *C23C 14/28* (2006.01)
  *C30B 23/02* (2006.01)
  *C30B 29/46* (2006.01)

(52) U.S. Cl.
  CPC ............ *C30B 23/025* (2013.01); *C30B 29/46* (2013.01); *G11B 11/105* (2013.01); *H01F 10/28* (2013.01); *H01F 10/30* (2013.01); *H01F 10/3209* (2013.01); *H01F 10/3245* (2013.01); *H01F 10/3254* (2013.01); *H01F 41/32* (2013.01)

(56) References Cited

U.S. PATENT DOCUMENTS

| | | | | |
|---|---|---|---|---|
| 5,589,261 A * | 12/1996 | Tamari | ............... | B82Y 25/00 204/192.2 |
| 5,665,465 A * | 9/1997 | Gyorgy | ............... | B82Y 25/00 428/328 |
| 5,702,793 A * | 12/1997 | Shimokawa | ............ | B82Y 25/00 369/13.35 |
| 5,965,287 A * | 10/1999 | Suzuki | ................ | H01F 1/346 252/62.56 |
| 6,759,137 B1 * | 7/2004 | Furuya | ................ | G11B 7/1275 369/13.38 |
| 2004/0197604 A1 * | 10/2004 | Furuya | ............. | G11B 11/10543 428/822.2 |
| 2008/0151615 A1 * | 6/2008 | Rodmacq | ........... | G01R 33/0322 365/173 |
| 2010/0291411 A1 * | 11/2010 | Kawakami | ............ | B82Y 40/00 428/815 |
| 2016/0265047 A1 * | 9/2016 | van Rooyen | ...... | G01N 27/4146 |
| 2017/0299904 A1 * | 10/2017 | Wang | ................... | G02F 1/0136 |
| 2019/0385655 A1 * | 12/2019 | Lin | ........................ | H01L 43/08 |
| 2019/0386120 A1 * | 12/2019 | Lin | .................... | H01L 29/66984 |
| 2019/0386208 A1 * | 12/2019 | Lin | ........................ | H01L 43/10 |
| 2019/0386662 A1 * | 12/2019 | Lin | ..................... | H03K 19/0944 |
| 2020/0020850 A1 * | 1/2020 | Dorrance | ................ | H01L 43/02 |
| 2020/0161535 A1 * | 5/2020 | Lin | ..................... | G11C 11/1675 |
| 2021/0055162 A1 * | 2/2021 | Rice | .......................... | G01J 1/42 |

OTHER PUBLICATIONS

Machine Translation of CN 107190321 A (CN 201710331977 A) (Year: 2017).*

Abstract of CN 110176533 (Year: 2019).*

* cited by examiner

SUPERLATTICE MATERIAL, AND PREPARATION METHOD AND APPLICATION THEREOF

TECHNICAL FIELD

The present invention relates to the technical field of superlattice magneto-optical material technologies, and in particular, to a superlattice material, and a preparation method and application thereof.

BACKGROUND

With the development of magneto-optical information storage technologies, it is quite difficult to satisfy a requirement of small and low power consumption storage applications by using a conventional information storage material and component architecture. From the research on a magneto-optical effect, it is found that an electromagnetic characteristic of a matter with an intrinsic magnetic moment changes under an action of an external magnetic field, so that a transmission characteristic of a light wave in the matter changes. A freedom degree of light determines that light has two intrinsic characteristics: a spin angular momentum and an orbital angular momentum. The light can be used as an information carrier, and has characteristics such as low energy consumption, high sensitivity, and quantized transport. Therefore, interaction between light and a matter is an important scientific means for implementing a nano-optoelectronic component, a high-density data storage device, and an optical switch component.

Therefore, a material with a strong magneto-optical effect is urgently needed currently.

SUMMARY

To resolve the foregoing technical problem, the present invention provides a superlattice material, and a preparation method and application thereof, where the superlattice material has a desirable magneto-optical effect.

To achieve the above purpose, the present invention provides the following technical solutions.

A superlattice material includes a substrate and a superlattice structure disposed on the substrate, where the superlattice structure is [first ferrimagnetic thin film/two-dimensional material layer/second ferrimagnetic thin film]$_n$, and n≥1;

the first ferrimagnetic thin film, the two-dimensional material layer, and the second ferrimagnetic thin film are laminated successively;

a material of the two-dimensional material layer is one or more of graphene, a topological insulator, a transition metal chalcogenide, and black phosphorus; and the first ferrimagnetic thin film and the two-dimensional material layer form a heterojunction structure, and the two-dimensional material layer and the second ferrimagnetic thin film form a heterojunction structure.

Preferably, the topological insulator is one or more of $Bi_2Te_3$, $Bi_2Se_3$, and $Bi_{0.9}Te_{0.1}$.

Preferably, materials of the first ferrimagnetic thin film and the second ferrimagnetic thin film are independently garnet type ferrites; and the garnet type ferrite is one or more of yttrium iron garnet, thulium iron garnet, and lutetium bismuth iron garnet.

Preferably, thicknesses of the first ferrimagnetic thin film and the second ferrimagnetic thin film are independently 1 nm to 10 μm.

Preferably, the two-dimensional material layer is an atomic layer, and a layer number of atomic layers is greater than or equal to 1.

Preferably, a material of the substrate is gadolinium gallium garnet, silicon monocrystal, gallium arsenide, or gallium nitride.

A preparation method of the above superlattice material includes the following step:

successively growing a first ferrimagnetic thin film, a two-dimensional material layer, and a second ferrimagnetic thin film on a substrate in a laminated manner, to obtain the superlattice material.

Preferably, methods for growing the first ferrimagnetic thin film and the second ferrimagnetic thin film are independently a pulsed laser deposition method, liquid phase epitaxy, or magnetron sputtering.

Preferably, a method for growing the two-dimensional material layer is a wetting transfer method, a molecular beam epitaxy method, or a chemical vapor deposition method.

The present invention further provides application of the above superlattice material or the superlattice material prepared by using the above preparation method in magneto-optical information storage, optical information processing, optical fiber communication, and the quantum information field.

The present invention provides a superlattice material, including a substrate and a superlattice structure disposed on the substrate, where the superlattice structure is [first ferrimagnetic thin film/two-dimensional material layer/second ferrimagnetic thin film]$_n$, and n≥1; the first ferrimagnetic thin film, the two-dimensional material layer, and the second ferrimagnetic thin film are laminated successively; a material of the two-dimensional material layer is one or more of graphene, a topological insulator, a transition metal chalcogenide, or black phosphorus; and the first ferrimagnetic thin film and the two-dimensional material layer form a heterojunction structure, and the two-dimensional material layer and the second ferrimagnetic thin film form a heterojunction structure. In the present invention, through configuration of the two-dimensional material layer between the first ferrimagnetic thin film and the second ferrimagnetic thin film, ground-state spin-orbit coupling between the ferrimagnetic thin films can be enhanced, thereby improving interband magneto-optical absorption performance of the ferrimagnetic thin films. During information processing by using the superlattice material, when incident light enters the ferrimagnetic thin films, a propagation characteristic of a light wave such as a polarization plane, a phase, or a scattering characteristics changes; and for a ferromagnetic thin film to which information is written, required information can be read out by changing a characteristic of a transmission light wave or an emitting light wave, thereby achieving better sensitivity and low power consumption. According to description of embodiments, the superlattice material in the present invention has two advantages: a relatively good magnetic property of a ferrous garnet material and a good photoelectric absorption characteristic of a two-dimensional semiconductor material such as graphene. Magneto-optical Kerr effect data obtained through testing shows that: A saturated magneto-optical Kerr angle of the superlattice material in the present invention is 13 mdeg in a magnetic field of 2500 Oe, and a magneto-optical Kerr angle of the superlattice material is increased by 2.5 times compared with a nonsuperlattice ferrimagnetic thin film material in which no two-dimensional material is inserted, thereby achieving magneto-optical effect enhancement. Compared with a conventional magnetic storage material, the superlattice material has a characteristic of using a magneto-optical effect for information processing, and has better sensitivity and low power consumption. Compared with a conventional magneto-optical material, the ferrogarnet/two-dimensional atomic crystal superlattice material has advantages such as an excellent light absorption characteristic. The superlattice material provided in the present invention has great application prospects in magneto-optical information storage, optical information processing, optical fiber communication, and the quantum information field.

DETAILED DESCRIPTION

Figure 1:
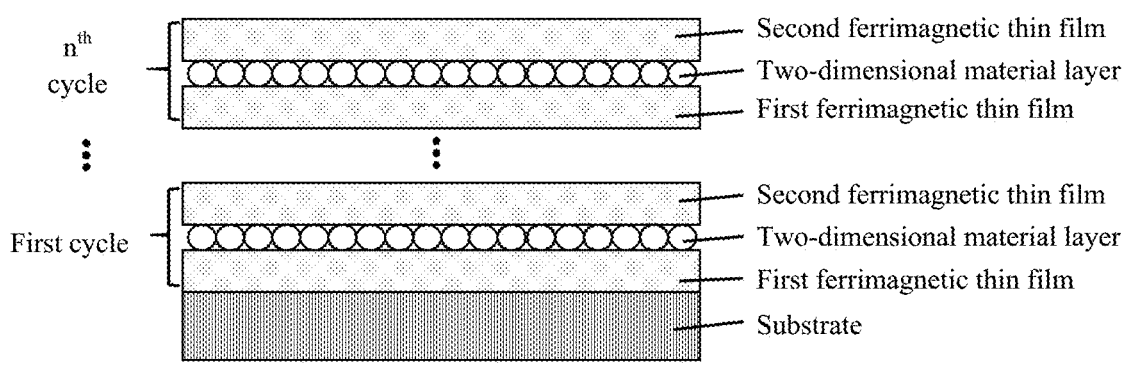
FIG. 1 is a structural side view of a superlattice material according to the present invention.

The present invention provides a superlattice material, including a substrate and a superlattice structure disposed on the substrate, where the superlattice structure is [first ferrimagnetic thin film/two-dimensional material layer/second ferrimagnetic thin film]$_n$, and n≥1;

the first ferrimagnetic thin film, the two-dimensional material layer, and the second ferrimagnetic thin film are laminated successively;

a material of the two-dimensional material layer is one or more of graphene, a topological insulator, a transition metal chalcogenide, and black phosphorus; and the first ferrimagnetic thin film and the two-dimensional material layer form a heterojunction structure, and the two-dimensional material layer and the second ferrimagnetic thin film form a heterojunction structure.

In the present invention, a material of the substrate is preferably gadolinium gallium garnet, silicon monocrystal, gallium arsenide, or gallium nitride, and more preferably the gadolinium gallium garnet. A thickness of the substrate is preferably 500 μm.

In the present invention, n≥1, and n is preferably 2 to 10 and more preferably 4 to 6.

In the present invention, materials of the first ferrimagnetic thin film and the second ferrimagnetic thin film are independently garnet type ferrites preferably; the garnet type ferrite is preferably one or more of yttrium iron garnet, thulium iron garnet, and lutetium bismuth iron garnet; and when the garnet type ferrite is more than two of the foregoing specific materials, a ratio of specific materials is not particularly limited in the present invention. Thicknesses of the first ferrimagnetic thin film and the second ferrimagnetic thin film are independently 1 nm to 10 μm preferably and more preferably 10 nm to 500 nm.

In the present invention, the material of the two-dimensional material layer is preferably one or more of the graphene, the topological insulator, the transition metal chalcogenide, and the black phosphorus. The topological insulator is preferably one or more of $Bi_2Te_3$, $Bi_2Se_3$, and $Bi_{0.9}Te_{0.1}$, and the transition metal chalcogenide is preferably molybdenum disulfide. When the material of the two-dimensional material layer is more than two of the foregoing specific materials, a ratio of specific materials is not particularly limited in the present invention, and mixing can be conducted at any ratio. The two-dimensional material layer is preferably an atomic layer. A layer number of atomic layers is greater than or equal to 1, preferably 2 to 10, and more preferably 4 to 6.

The present invention further includes a preparation method of the superlattice material in the foregoing technical solution, including the following step:

successively growing a first ferrimagnetic thin film, a two-dimensional material layer, and a second ferrimagnetic thin film on a substrate in a laminated manner, to obtain the superlattice material.

In the present invention, unless otherwise specified, all raw material components are commercially available products well known to persons skilled in the art.

In the present invention, before the first ferrimagnetic thin film is grown on the substrate, the substrate is preferably pretreated. The pretreatment is preferably cleaning with acetone, ethanol, and deionized water successively, and cleaning is conducted in an ultrasonic condition. The ultrasonic condition is not particularly limited in the present invention.

In the present invention, a method for growing the first ferrimagnetic thin film is preferably a pulsed laser deposition method, liquid phase epitaxy, or magnetron sputtering, and more preferably the pulsed laser deposition method.

When the method for growing the first ferrimagnetic thin film is liquid phase epitaxy, a process of liquid phase epitaxy preferably includes: accurately weighing a high-purity first ferrimagnetic thin film material, conducting grinding and mixing, and placing the material into a platinum crucible for melting to obtain uniform melt; and placing the cleaned substrate into the uniform melt for liquid phase epitaxy and conducting cleaning to obtain the first ferrimagnetic thin film. The melting preferably includes first melting at 1000° C. to 1100° C. for 12 h to 24 h, cooling to 950° C. to 1000° C., and stirring for 8 h to 12 h, and more preferably includes first melting at 1040° C. to 1060° C. for 15 h to 20 h, cooling to 960° C. to 980° C., and stirring for 10 h. Temperature of liquid phase epitaxy is preferably 950° C., a rotation speed of the substrate is preferably 120 rpm, and a time for liquid phase epitaxy is preferably 10 s to 2 min.

When the method for growing the first ferrimagnetic thin film is magnetron sputtering, oxygen partial pressure used for magnetron sputtering is preferably 1 Pa to 10 Pa and more preferably 5 Pa; temperature of the substrate in magnetron sputtering is preferably 700° C. to 800° C. and more preferably 750° C.; and power for magnetron sputtering is preferably 20 W to 100 W and more preferably 35 W.

When the method for growing the first ferrimagnetic thin film is the pulsed laser deposition method, a target-substrate distance in the pulsed laser deposition method is preferably 7 cm; the pulsed laser deposition method is preferably conducted in an oxygen atmosphere, and pressure in the oxygen atmosphere is preferably 0.5 Pa to 1.5 Pa and more preferably 1.0 Pa; temperature of pulsed laser deposition is preferably 700° C. to 800° C. and more preferably 750° C.; a heating rate is preferably 8° C./min to 12° C./min and more preferably 10° C./min; a time for pulsed laser deposition is preferably 15 min to 25 min and more preferably 20 min; laser energy of pulsed laser deposition is preferably 250 mJ to 350 mJ and more preferably 300 mJ; and a laser frequency is preferably 4 Hz to 10 Hz and more preferably 5 Hz.

A process of the pulsed laser deposition method preferably includes placing the substrate in a pulsed laser deposition cavity, and setting a target-substrate distance; heating the substrate to 700° C. to 800° C. in a vacuum environment lower than or equal to $10^{-6}$ Pa; introducing oxygen gas into the cavity; starting a laser and setting a laser parameter; opening a substrate baffle for deposition, and closing the substrate baffle after deposition; and finally cooling the substrate to indoor temperature at a rate of 4° C./min to 6° C./min to obtain the first ferrimagnetic thin film.

In the present invention, a method for growing the two-dimensional material layer is preferably wetting transfer, molecular beam epitaxy, or chemical vapor deposition.

When the method for growing the two-dimensional material layer is molecular beam epitaxy, a specific process of molecular beam epitaxy is not particularly limited in the present invention, provided that the process used is a process well known by persons skilled in the art.

When the method for growing the two-dimensional material layer is chemical vapor deposition, a specific process of chemical vapor deposition is not particularly limited in the present invention, provided that the process used is a process well known by persons skilled in the art.

When the method for growing the two-dimensional material layer is wetting transfer, wetting transfer includes the following steps:

coating PMMA to one surface of a two-dimensional double-sided copper-based material thin film;

placing the surface coated with no PMMA to the surface of a ferric chloride solution, conducting etching for 3 min, washing the two-dimensional material thin film coated with no PMMA with the ferric chloride solution; and continuing to place the two-dimensional material thin film to the surface of the ferric chloride solution, and conducting etching for 1 h to fully corrode the copper layer, to make the two-dimensional PMMA-coated material thin film float on the surface of the ferric chloride solution;

taking out the two-dimensional PMMA-coated material thin film from bottom to top with a glass slide, and placing into a culture plate containing deionized water (the two-dimensional PMMA-coated material thin film floats on the surface of the deionized water); and taking out the two-dimensional PMMA-coated material thin film from bottom to top with the substrate on which the first ferrimagnetic thin film is grown, to make the two-dimensional PMMA-coated material thin film located in the center of the substrate on which the first ferrimagnetic thin film is grown, conducting drying (placing the sample on a water absorbent material for natural air drying) and heat treatment, and removing the PMMA with an acetone solution to obtain the substrate on which the two-dimensional material layer is grown on the surface of the first ferrimagnetic thin film.

In the present invention, heat treatment temperature is preferably 100° to 120° C., more preferably 105° C. to 115° C., and most preferably 110° C.; and a heat treatment time is preferably 0.5 h to 1.5 h, more preferably 0.8 h to 1.2 h, and most preferably 1.0 h. In the present invention, heat treatment is conducted to make the two-dimensional material layer and the first ferrimagnetic thin film attached more closely and form a heterojunction.

In the present invention, a method for growing the second ferrimagnetic thin film is preferably a pulsed laser deposition method, liquid phase epitaxy, or magnetron sputtering, and more preferably the pulsed laser deposition method.

When the method for growing the second ferrimagnetic thin film is liquid phase epitaxy, a process of liquid phase epitaxy preferably includes: accurately weighing a high-purity second ferrimagnetic thin film material, conducting grinding and mixing, and placing the material into a platinum crucible for melting to obtain uniform melt; and placing the cleaned substrate into the uniform melt for liquid phase epitaxy and conducting cleaning to obtain the second ferrimagnetic thin film. The melting preferably includes first melting at 1000° C. to 1100° C. for 12 h to 24 h, cooling to 950° C. to 1000° C., and stirring for 8 h to 12 h, and more preferably includes first melting at 1040° C. to 1060° C. for 15 h to 20 h, cooling to 960° C. to 980° C., and stirring for 10 h. Temperature of liquid phase epitaxy is preferably 950° C., a rotation speed of the substrate is preferably 120 rpm, and a time for liquid phase epitaxy is preferably 10 s to 2 min.

When the method for growing the second ferrimagnetic thin film is magnetron sputtering, oxygen partial pressure used for magnetron sputtering is preferably 1 Pa to 10 Pa and more preferably 5 Pa; temperature of the substrate in magnetron sputtering is preferably 700° C. to 800° C. and more preferably 750° C.; and power for magnetron sputtering is preferably 20 W to 100 W and more preferably 35 W.

When the method for growing the second ferrimagnetic thin film is the pulsed laser deposition method, a target-substrate distance in the pulsed laser deposition method is preferably 7 cm; the pulsed laser deposition method is preferably conducted in an oxygen atmosphere, and pressure in the oxygen atmosphere is preferably 0.5 Pa to 1.5 Pa and more preferably 1.0 Pa; temperature of pulsed laser deposition is preferably 700° C. to 800° C. and more preferably 750° C.; a heating rate is preferably 8° C./min to 12° C./min and more preferably 10° C./min; a time for pulsed laser deposition is preferably 15 min to 25 min and more preferably 20 min; laser energy of pulsed laser deposition is preferably 250 mJ to 350 mJ and more preferably 300 mJ; and a laser frequency is preferably 4 Hz to 10 Hz and more preferably 5 Hz.

A process of the pulsed laser deposition method preferably includes placing the substrate in a pulsed laser deposition cavity, and setting a target-substrate distance; heating the substrate to 700° C. to 800° C. in a vacuum environment lower than or equal to $10^{-6}$ Pa; introducing oxygen gas into the cavity; starting a laser and setting a laser parameter; opening a substrate baffle for deposition, and closing the substrate baffle after deposition; and finally cooling the substrate to indoor temperature at a rate of 4° C./min to 6° C./min to obtain the second ferrimagnetic thin film.

The present invention further provides application, of the superlattice material in the foregoing technical solution or the superlattice material prepared by using the preparation method in the foregoing technical solution, in magneto-optical information storage, optical information processing, optical fiber communication, and the quantum information field.

With reference to embodiments, the following describes in details the superlattice material, and a preparation method and application thereof that are provided in the present invention, but cannot be understood as a limitation to the protection scope of the present invention.

Embodiment 1

A superlattice material is provided, where a material of a substrate is gadolinium gallium garnet (GGG) monocrystal substrate, a material of a first ferrimagnetic thin film is yttrium iron garnet (YIG) (60 nm), a material of a two-dimensional material layer is single-layer graphene, and a material of a second ferrimagnetic thin film is yttrium iron garnet (YIG) (60 nm).

A preparation method thereof includes the following steps:

(1) cleaning the substrate material with acetone, ethanol, and deionized water successively in an ultrasonic condition;

(2) placing the substrate in a pulsed laser deposition cavity, and setting a target-substrate distance (7 cm); heating the substrate to 750° C. in a vacuum environment lower than or equal to $10^{-6}$ Pa at a heating rate of 10° C./min; introducing oxygen gas (pressure is 1.0 Pa) into the cavity; starting a laser and setting a laser parameter (laser energy is 300 mJ, and a laser frequency is 5 Hz); opening a substrate baffle for deposition for 20 min, and closing the substrate baffle after deposition; and finally cooling the substrate to indoor temperature at a rate of 5° C./min to obtain the yttrium iron garnet (YIG) thin film layer (60 nm);

(3) coating PMMA to one surface of a double-sided copper-based graphene thin film;

placing the surface coated with no PMMA to the surface of a ferric chloride solution, conducting etching for 3 min, washing the graphene thin film coated with no PMMA with the ferric chloride solution; and continuing to place the graphene thin film to the surface of the ferric chloride solution, and conducting etching for 1 h to fully corrode the copper layer, to make the PMMA-coated graphene thin film float on the surface of the ferric chloride solution;

taking out the PMMA-coated graphene thin film from bottom to top with a glass slide, and placing into a culture plate containing deionized water (the PMMA-coated graphene thin film floats on the surface of the deionized water);

taking out the PMMA-coated graphene thin film from bottom to top with the substrate on which the yttrium iron garnet (YIG) thin film is grown, to make the PMMA-coated graphene thin film located in the center of the substrate on which the yttrium iron garnet (YIG) thin film layer is grown, conducting drying (placing the sample on a water absorbent material for natural air drying) and heat treatment, and removing the PMMA with an acetone solution to obtain the substrate on which the graphene thin film (single-layer graphene) is grown on the surface of the yttrium iron garnet (YIG) thin film layer (the yttrium iron garnet (YIG) thin film layer and the graphene thin film forms a heterojunction structure); and (4) placing the substrate obtained in step (3) in a pulsed laser deposition cavity, and setting a target-substrate distance (7 cm); heating the substrate to 750° C. in a vacuum environment lower than or equal to $10^{-6}$ Pa at a heating rate of 10° C./min; introducing oxygen gas (pressure is 1.0 Pa) into the cavity; starting a laser and setting a laser parameter (laser energy is 300 mJ, and a laser frequency is 5 Hz); opening a substrate baffle for deposition for 20 min, and closing the substrate baffle after deposition; and finally cooling the substrate to indoor temperature at a rate of 5° C./min, to obtain the yttrium iron garnet (YIG) thin film layer (60 nm) and finally obtain the superlattice material, denoted as YIG (60 nm)/graphene/YIG (60 nm).

Embodiment 2

A superlattice material is provided, where a material of a substrate is gadolinium gallium garnet (GGG) monocrystal substrate, a material of a first ferrimagnetic thin film is thulium iron garnet (TmIG) (60 nm), a material of a two-dimensional material layer is single-layer graphene, and a material of a second ferrimagnetic thin film is thulium iron garnet (TmIG) (60 nm).

For a preparation method thereof, refer to Embodiment 1.

Embodiment 3

A superlattice material is provided, where a material of a substrate is gadolinium gallium garnet (GGG) monocrystal substrate, a material of a first ferrimagnetic thin film is lutecium bismuth iron garnet (LuBiIG) (60 nm), a material of a two-dimensional material layer is single-layer graphene, and a material of a second ferrimagnetic thin film is lutecium bismuth iron garnet (LuBiIG) (60 nm).

For a preparation method thereof, refer to Embodiment 1.

Embodiment 4

A superlattice material is provided, where a material of a substrate is gadolinium gallium garnet (GGG) monocrystal substrate, a material of a first ferrimagnetic thin film is yttrium iron garnet (YIG) (60 nm), a material of a two-dimensional material layer is a topological insulator $Bi_2Te_3$ (20 nm), and a material of a second ferrimagnetic thin film is yttrium iron garnet (YIG) (60 nm).

For preparation methods of all other materials except growth of the topological insulator $Bi_2Te_3$, refer to Embodiment 1.

A process for growing the topological insulator $Bi_2Te_3$ layer (molecular beam epitaxy) includes heating the substrate to above 600° C. in a condition of a vacuum degree larger than or equal to $10^{-8}$ Pa, to remove gas adsorbed by the substrate, heating high-purity solid source materials Bi and Te respectively at 480° C. and 350° C., and preparing the two-dimensional material $Bi_2Te_3$ at substrate temperature of 450° C.

Embodiment 5

A superlattice material is provided. Refer to Embodiment 1, a difference between the superlattice material herein and the superlattice material in Embodiment 1 is that the graphene layer is replaced by a molybdenum disulfide ($MoS_2$) film layer (monatomic layer).

Comparative Example 1

(1) Clean a substrate material with acetone, ethanol, and deionized water successively in an ultrasonic condition.

(2) Place the substrate in a pulsed laser deposition cavity, and set a target-substrate distance (7 cm); heat the substrate to 750° C. in a vacuum environment lower than or equal to $10^{-6}$ Pa at a heating rate of 10° C./min; introduce oxygen gas (pressure is 1.0 Pa) into the cavity; start a laser and set a laser parameter (laser energy is 300 mJ, and a laser frequency is 5 Hz); open a substrate baffle for deposition for 20 min, and close the substrate baffle after deposition; and finally cool the substrate to indoor temperature at a rate of 5° C./min to obtain the yttrium iron garnet (YIG) thin film layer (60 nm), to obtain a superlattice material (denoted as YIG (120 nm)).

Test Example

Figure 2:
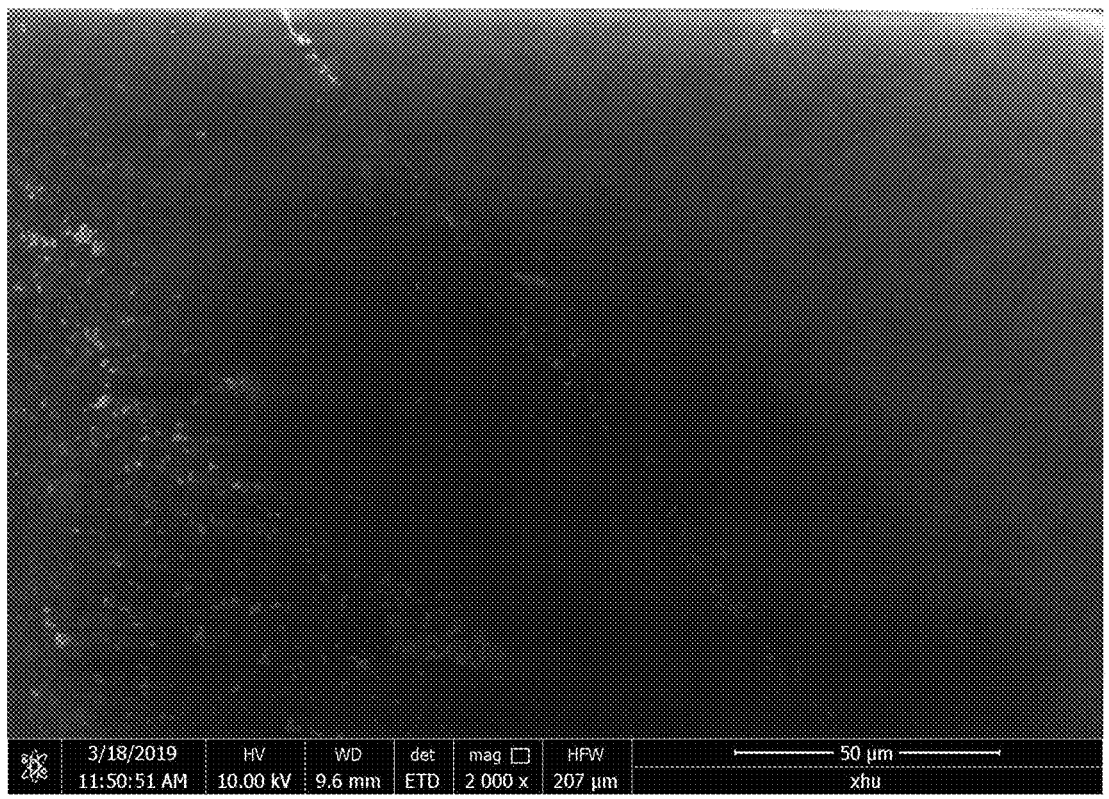
FIG. 2 is a scanning electron microscope image of a superlattice material prepared in Embodiment 1.

The superlattice material obtained in Embodiment 1 is characterized by a scanning electron microscope. A test result is shown in FIG. 2. It can be seen from the figure that, an obvious graphene boundary morphology can be seen on a surface of the superlattice material prepared in Embodiment 1, and in the figure, a dense polygonal block graphic region at the lower left corner is a transferred two-dimensional graphene material, and a smooth surface at the upper right corner is a ferrimagnetic YIG thin film region.

Figure 3:
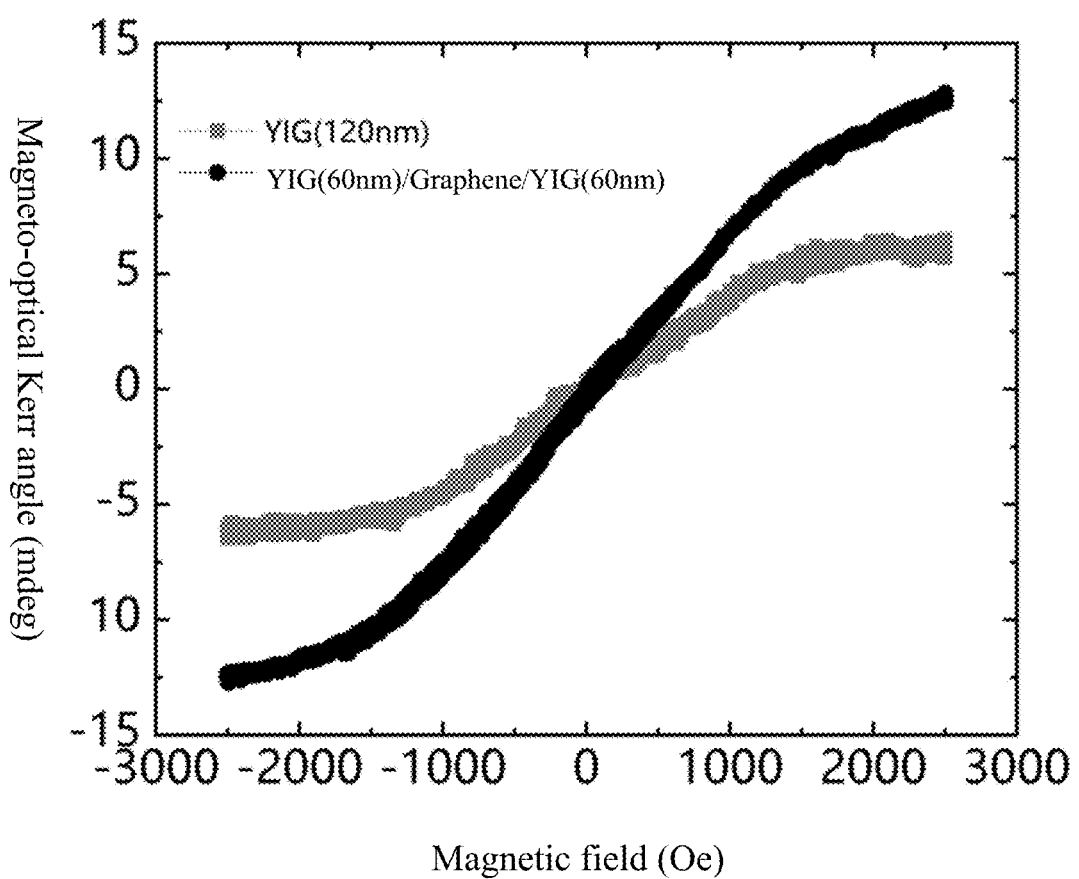
FIG. 3 is a magneto-optical Kerr signal enhancement diagram of the superlattice material prepared in Embodiment 1 and a superlattice material prepared in a comparative example 1.

A magneto-optical Kerr test is conducted on the superlattice materials obtained in Embodiment 1 and the comparative example 1, and a test result is shown in FIG. 3. It can be learned from the figure that, a magneto-optical Kerr angle of a YIG thin film with a thickness of 120 nm becomes saturated after reaching 5 mdeg in a magnetic field of 2500 Oe, and after one two-dimensional graphene atomic layer is inserted between YIG thin films, a saturated magneto-optical Kerr angle of the YIG thin film increases to 13 mdeg in the magnetic field of 2500 Oe.

Figure 4:
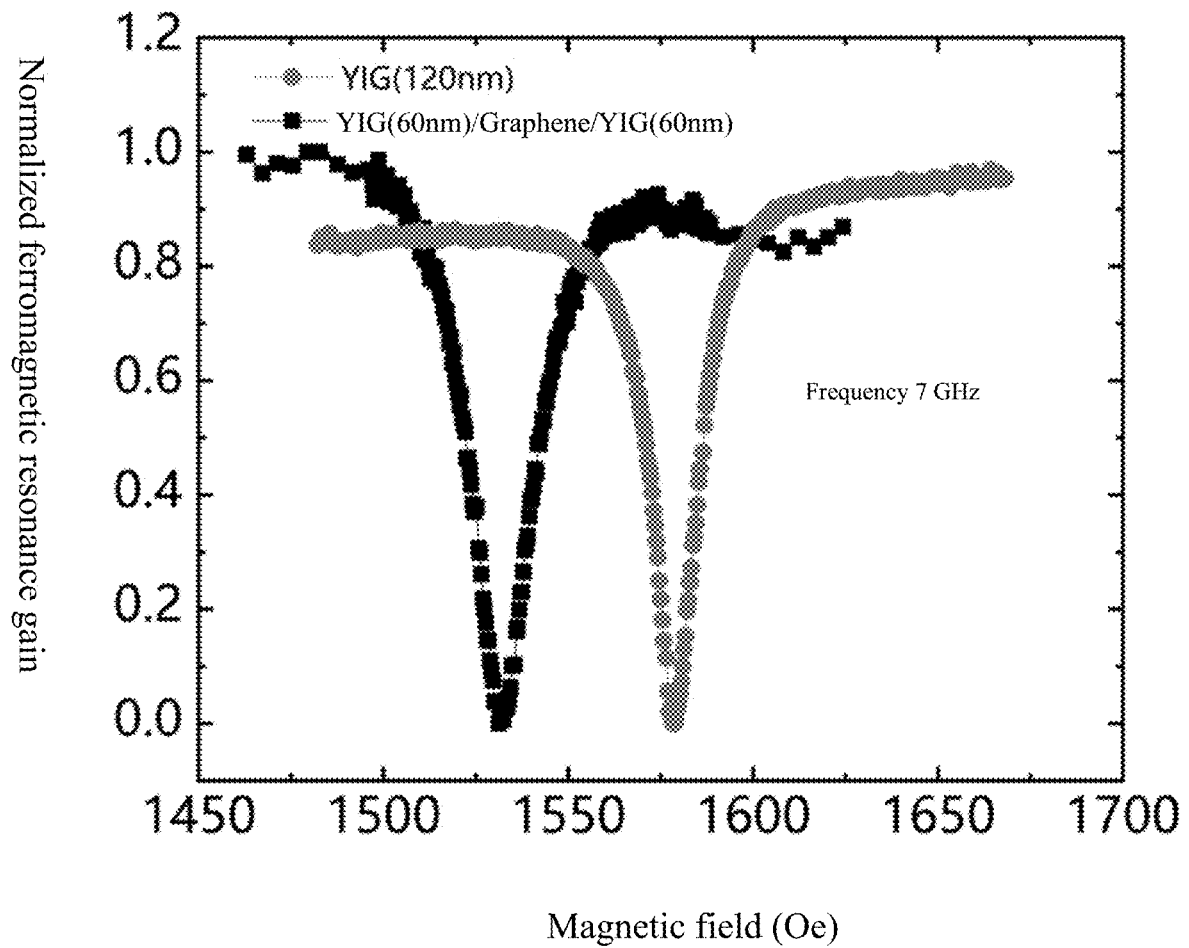
FIG. 4 is a nuclear magnetic resonance linewidth broadening diagram of the superlattice material prepared in Embodiment 1 and the superlattice material prepared in the comparative example 1.
Figure 5:
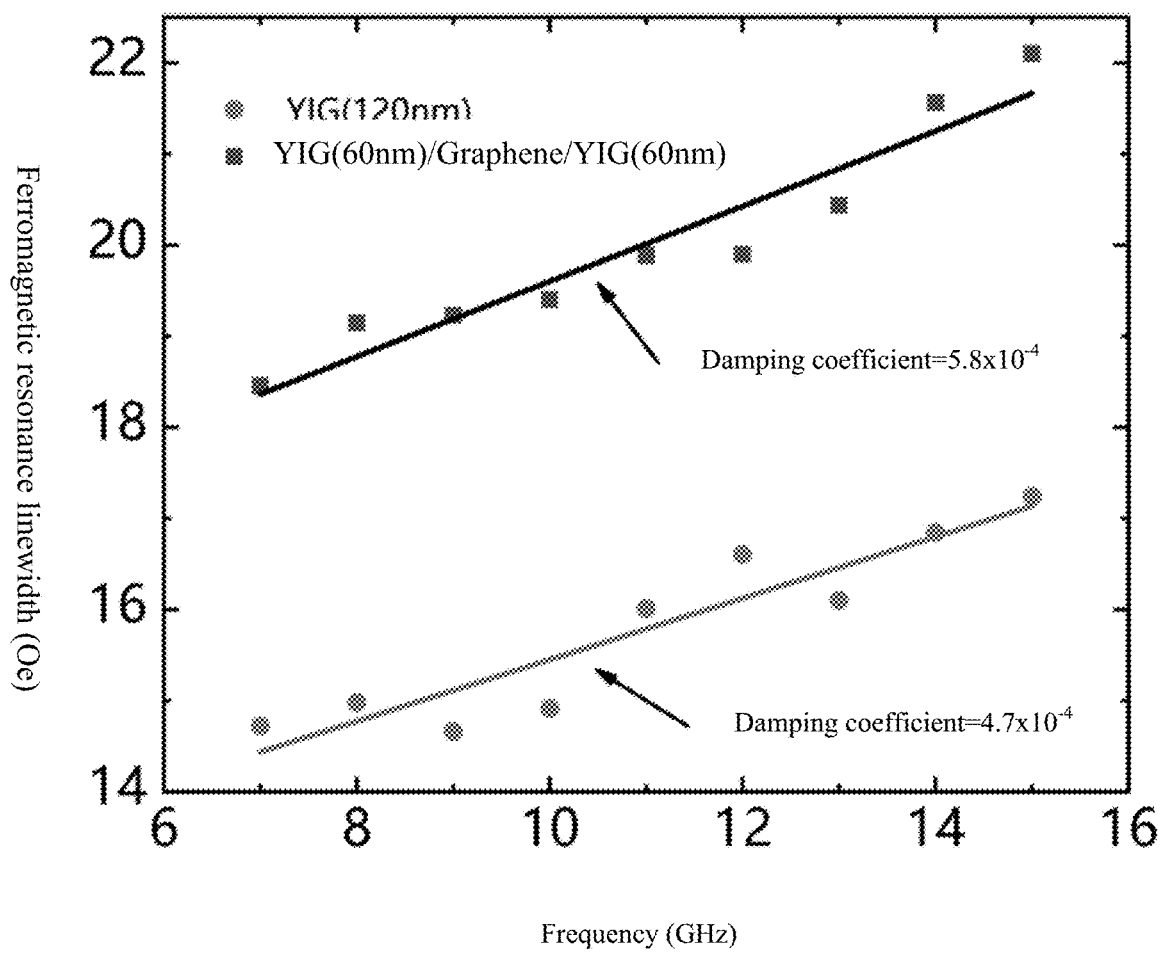
FIG. 5 is a damping enhancement diagram of the superlattice material prepared in Embodiment 1 and the superlattice material prepared in the comparative example 1.

A ferromagnetic resonance test is conducted on the superlattice materials obtained in Embodiment 1 and the comparative example 1, and test results are shown in FIG. 4 and FIG. 5. It can be learned from the figures that, after one two-dimensional graphene atomic layer is inserted into YIG films with the same thickness of 120 nm, a ferromagnetic resonance peak of the YIG thin film shifts to a low magnetic field, a ferromagnetic resonance linewidth is increased at a frequency of 7 GHz to 15 GHz, and a Gilbert damping factor is increased.

It can be learned from the foregoing embodiments that a saturated magneto-optical Kerr angle of the superlattice material provided in the present invention is 13 mdeg in a magnetic field of 2500 Oe, and a magneto-optical Kerr angle of the superlattice material is increased by 2.5 times compared with a nonsuperlattice ferrimagnetic thin film material into which no two-dimensional material is inserted, thereby achieving magneto-optical effect enhancement.

The foregoing descriptions are only preferred implementation manners of the present invention. It should be noted that for a person of ordinary skill in the art, several improvements and modifications may further be made without departing from the principle of the present invention. These improvements and modifications should also be deemed as falling within the protection scope of the present invention.

What is claimed is:

1. A superlattice material, comprising a substrate and a superlattice structure disposed on the substrate, wherein
   the superlattice structure is [first ferrimagnetic thin film/two-dimensional material layer/second ferrimagnetic thin film]$_n$, and n≥1;
   the first ferrimagnetic thin film, the two-dimensional material layer, and the second ferrimagnetic thin film are laminated successively;
   a material of the two-dimensional material layer is one or more of graphene, an insulator, a transition metal chalcogenide, and black phosphorus;
   the first ferrimagnetic thin film and the two-dimensional material layer form a heterojunction structure, and the two-dimensional material layer and the second ferrimagnetic thin film form a heterojunction structure:
   the insulator is one or more of $Bi_2Te_3$, $Bi_2Se_3$, and $Bi_{0.9}Te_{0.1}$;
   a material of the first ferrimagnetic thin film and the second ferrimagnetic thin film is independently garnet type ferrites; and the garnet type ferrite is one or more of yttrium iron garnet, thulium iron garnet, and lutetium bismuth iron garnet;
   a thicknesses of the first ferrimagnetic thin film and the second ferrimagnetic thin film are independently 1 nm to 10 μm;
   a magneto-optical Kerr angle of the superlattice material is increased by 2.5 times compared with ferrimagnetic thin film material in which nor two-dimensional material is inserted.

2. The superlattice material according to claim 1, wherein the two-dimensional material layer is an atomic layer, and a layer number of atomic layers is greater than or equal to 1.

3. The superlattice material according to claim 1, wherein a material of the substrate is gadolinium gallium garnet, silicon monocrystal, gallium arsenide, or gallium nitride.

4. A preparation method of the superlattice material according to claim 1, comprising the following step:
   successively growing a first ferrimagnetic thin film, a two-dimensional material layer, and a second ferrimagnetic thin film on a substrate in a laminated manner, to obtain the superlattice material.

5. The preparation method according to claim 4, wherein methods for growing the first ferrimagnetic thin film and the second ferrimagnetic thin film are independently a pulsed laser deposition method, liquid phase epitaxy, or magnetron sputtering.

6. The preparation method according to claim 4, wherein a method for growing the two-dimensional material layer is a wetting transfer method, a molecular beam epitaxy method, or a chemical vapor deposition method.

7. Application of the superlattice material according to claim 1 in magneto-optical information storage, optical information processing, optical fiber communication, and the quantum information field.

8. Application of the superlattice material prepared by using the preparation method according to claim 4 in magneto-optical information storage, optical information processing, optical fiber communication, and the quantum information field.

9. Application of the superlattice material prepared by using the preparation method according to claim 5 in magneto-optical information storage, optical information processing, optical fiber communication, and the quantum information field.

10. Application of the superlattice material prepared by using the preparation method according to claim 6 in magneto-optical information storage, optical information processing, optical fiber communication, and the quantum information field.

* * * * *